United States Patent
Kim et al.

(10) Patent No.: US 7,656,185 B2
(45) Date of Patent: Feb. 2, 2010

(54) SEMICONDUCTOR INTEGRATED CIRCUIT DEVICE WITH A FAIL-SAFE IO CIRCUIT AND ELECTRONIC DEVICE INCLUDING THE SAME

(75) Inventors: Dae Gyu Kim, Suwon-si (KR); Eon Guk Kim, Seoul (KR); Ju Young Kim, Seoul (KR)

(73) Assignee: Samsung Electronics Co., Ltd., Suwon-si, Gyeonggi-Do (KR)

( * ) Notice: Subject to any disclaimer, the term of this patent is extended or adjusted under 35 U.S.C. 154(b) by 63 days.

(21) Appl. No.: 11/826,312

(22) Filed: Jul. 13, 2007

(65) Prior Publication Data

US 2008/0036490 A1    Feb. 14, 2008

(30) Foreign Application Priority Data

Aug. 11, 2006    (KR) ............... 10-2006-0075920

(51) Int. Cl.
*H03K 19/007*    (2006.01)

(52) U.S. Cl. ............... 326/14; 326/38; 327/77; 327/108

(58) Field of Classification Search ............ 326/38–41, 326/81, 83, 14
See application file for complete search history.

(56) References Cited

U.S. PATENT DOCUMENTS

| | | | | |
|---|---|---|---|---|
| 5,656,953 A | * | 8/1997 | Whetsel | 326/83 |
| 5,760,643 A | * | 6/1998 | Whetsel | 327/565 |
| 6,184,700 B1 | * | 2/2001 | Morris | 326/14 |
| 6,188,271 B1 | | 2/2001 | Wang et al. | |
| 6,320,406 B1 | * | 11/2001 | Morgan et al. | 326/14 |
| 6,356,106 B1 | * | 3/2002 | Greeff et al. | 326/30 |
| 6,396,315 B1 | * | 5/2002 | Morris | 327/112 |
| 6,420,913 B1 | * | 7/2002 | Ang et al. | 327/108 |
| 6,445,245 B1 | * | 9/2002 | Schultz et al. | 327/541 |
| 6,573,747 B2 | * | 6/2003 | Radhakrishnan | 326/30 |
| 6,924,673 B2 | * | 8/2005 | Tanishima | 327/108 |
| 2002/0067185 A1 | | 6/2002 | Kunz et al. | |
| 2006/0091906 A1 | * | 5/2006 | Tanaka et al. | 326/50 |
| 2007/0296441 A1 | * | 12/2007 | Whetsel | 324/763 |

FOREIGN PATENT DOCUMENTS

JP    09-185403    7/1997

* cited by examiner

*Primary Examiner*—Vibol Tan
(74) *Attorney, Agent, or Firm*—Lee & Morse, P.C.

(57) ABSTRACT

A semiconductor IC device includes at least one IO port, a core logic, and at least one fail-safe IO circuit, the fail-safe IO circuit being coupled between the core logic and the IO port, wherein the fail-safe IO circuit is configured to receive a predetermined control signal and to maintain the IO port at a predetermined impedance with respect to the predetermined control signal.

16 Claims, 6 Drawing Sheets

SEMICONDUCTOR INTEGRATED CIRCUIT DEVICE WITH A FAIL-SAFE IO CIRCUIT AND ELECTRONIC DEVICE INCLUDING THE SAME

BACKGROUND OF THE INVENTION

1. Field of the Invention

Embodiments of the present invention relate to a semiconductor integrated circuit device and an electronic device including the same. In particular, embodiments of the present invention relate to a semiconductor integrated circuit device having a fail-safe input/output circuit providing an improved fail-safe operation.

2. Description of the Related Art

In electronic systems, e.g., mobile or portable devices operated with batteries, minimized power consumption may be desired. Accordingly, such electronic systems may include a non operational state, e.g., a "standby" mode, capable of reducing power consumption. For example, at a "standby" mode, a fail-safe circuit may be used to turn off an internal logic power, i.e., a core power, in order to reduce leakage current therein. Additionally, the fail-safe circuit may turn off an input/output (IO) power in an effort to reduce the overall power consumption further.

However, when a conventional fail-safe circuit is used to control an electronic system having a plurality of subsystems connected via a common bus, faulty signals may be generated between the subsystems. More specifically, when an electronic system includes two or more subsystems, proper data exchange between the subsystems may require setting at least one subsystem at a "standby" mode, i.e., setting the subsystem to receive and/or to transmit no data. However, when input/output (IO) ports of the "standby" subsystem are not at a high impedance state, some "indeterminate" current may flow into the "standby" subsystem via the common bus due to signal transfer of other subsystems, i.e., non-standby subsystems. For example, signal transmission between two subsystems may trigger undesired current flow into an IO port of a third subsystem set as "standby" subsystem.

Such undesired current flow may increase power consumption of the "standby" subsystem despite turned off core and/or I/O powers. Further, the current flow into the "standby" subsystem may generate noise. The noise may be interpreted as a transmission signal, thereby triggering incorrect subsystem operation and causing circuitry damage, reduced system reliability, and overall increased power consumption. Accordingly, there exists a need for a subsystem, e.g., a semiconductor device, with a fail-safe IO circuit capable of minimizing false signal transmission at a "standby" mode thereof.

SUMMARY OF THE INVENTION

Embodiments of the present invention are therefore directed to a semiconductor integrated circuit (IC) device and an electronic device including the same, which substantially overcome one or more of the disadvantages of the related art.

It is therefore a feature of an embodiment of the present invention to provide a semiconductor IC device with a fail-safe IO circuit capable of minimizing transmission of erroneous signals in a common bus.

It is therefore another feature of an embodiment of the present invention to provide an electronic device including a present invention semiconductor IC device with a fail-safe IO circuit capable of improving reliability and operability thereof.

At least one of the above and other features and advantages of the present invention may be realized by providing a semiconductor IC device, including an IO port, a core logic, and a fail-safe IO circuit, the fail-safe IO circuit having at least first and second inputs and at least one output, the first input being coupled to the core logic, the second input being coupled to a control signal, and the output being coupled to the IO port, wherein the fail-safe IO circuit is configured to maintain the IO port at a predetermined impedance with respect to a predetermined control signal from the second input. The fail-safe IO circuit may include a plurality of fail-safe IO cells, each fail safe IO cell having a gate circuit and being coupled to a respective IO port.

The fail-safe IO circuit may be configured to maintain the IO port at high impedance with respect to a signal indicating a fail-safe mode. The semiconductor IC device may further include an IO power clamping IO circuit configured to maintain an IO power port as ground at the fail-safe mode. The IO power clamping IO circuit may include an NMOS transistor between the IO power port and a ground port, the NMOS transistor being coupled to the predetermined control signal.

The fail-safe IO circuit may include at least one gate circuit configured to receive the predetermined control signal. The gate circuit may be configured to turn off the IO port when the predetermined control signal is at a first logic state. The gate circuit may be configured to transfer data from the core logic when the predetermined control signal is at a second logic state. The semiconductor IC device may further include a control signal receiving IO circuit coupled to the fail-safe IO circuit, the control signal receiving IO circuit configured to receive an input signal and to output the predetermined control signal. The control signal receiving IO circuit may include a noise blocking buffer having an RC filter and a Schmitt-trigger inverter. The noise blocking buffer may further include an inverter adapted to invert an output signal of the Schmitt-trigger inverter. The noise blocking buffer may further include at least one capacitor adapted to store an output signal of the Schmitt-trigger inverter.

At least one of the above and other features and advantages of the present invention may be further realized by providing an electronic device, including a common bus, and a plurality of semiconductor IC devices coupled to the common bus, at least one of the semiconductor IC devices including at least one IO port connected to the common bus, a core logic, and at least one fail-safe IO circuit coupled between the IO port and the core logic, the fail-safe IO circuit configured to maintain the IO port at high impedance with respect to a predetermined control signal and to set the semiconductor IC device at a fail-safe mode.

The semiconductor IC device having the fail-safe IO circuit may be a master device. The semiconductor IC device having the fail-safe IO circuit may be configured to generate the predetermined control signal internally. Alternatively, the electronic device may further include a controller connected to the common bus. The semiconductor IC device having the fail-safe IO circuit may be configured to receive the predetermined control signal from the controller.

The semiconductor IC device having the fail-safe IO circuit may further include a control signal receiving IO circuit configured to receive an input signal and to output the predetermined control signal. The fail-safe IO circuit of the semiconductor IC device may include a plurality of fail-safe IO cells, each fail safe IO cell having a gate circuit and being coupled to a respective IO port.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
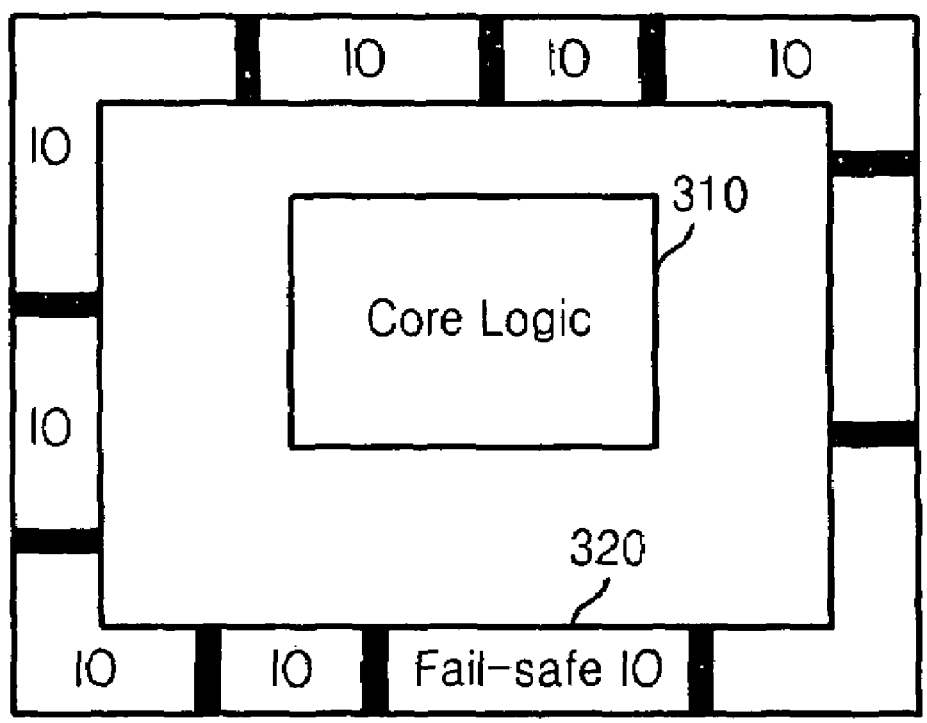
FIG. 1 illustrates a schematic view of a semiconductor IC device according to an embodiment of the present invention.

Korean Patent Application No. 10-2006-0075920, filed on Aug. 11, 2006, in the Korean Intellectual Property Office, and entitled: "Semiconductor Integrated Circuit Device Including Fail-Safe IO Circuit and Electronic Device Including the Same," is incorporated by reference herein in its entirety.

Exemplary embodiments of the present invention will now be described more fully hereinafter with reference to the accompanying drawings. Aspects of the invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

In the figures, the dimensions of elements and regions may be exaggerated for clarity of illustration, and like reference numerals refer to like elements throughout. It will be understood that when an element is referred to as being "connected between" or "coupled between" other element, it can be directly connected or coupled to the other element or intervening elements may be present. Further, it will be understood that the term "and/or" includes any and all combinations of one or more of the associated listed items. It should further be understood that the singular forms "a," "an," and "the" include the plural forms as well, unless the context clearly indicates otherwise. Unless otherwise defined, all terminology used herein is given its ordinary meaning in the art, and therefore, should be interpreted within the context of the specification and the knowledge of one of ordinary skill in the art.

Figure 2:
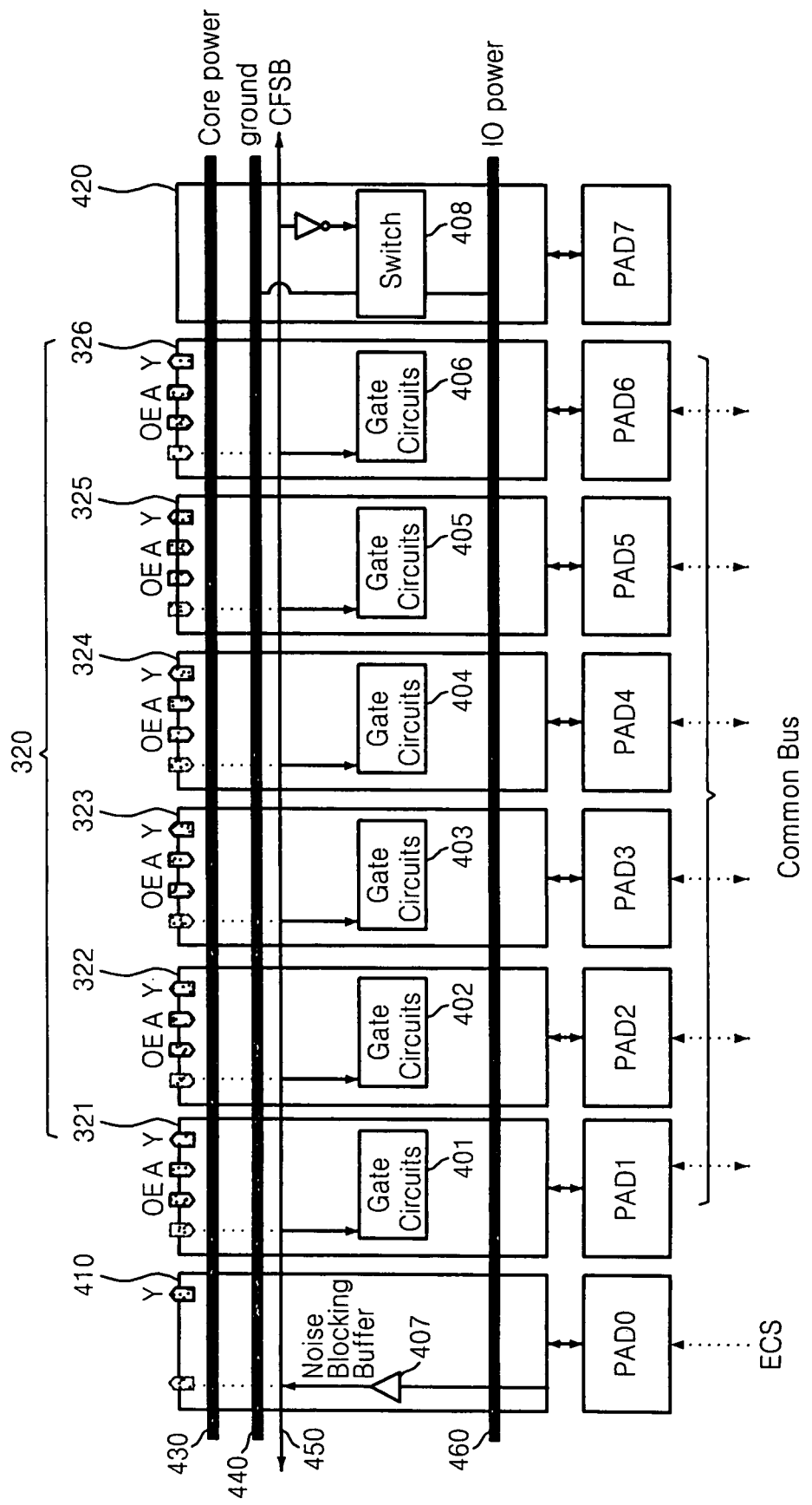
FIG. 2 illustrates a partial detailed layout of a semiconductor IC device according to an embodiment of the present invention.

Exemplary embodiments of a semiconductor IC device according to the present invention will now be described more fully with reference to FIGS. 1-5. As illustrated in FIGS. 1-2, a semiconductor IC device 300 may be a unit capable of receiving and/or transmitting predetermined data. The semiconductor IC device 300 may include an internal logic circuit 310, i.e., a core logic, a control signal receiving IO circuit 410, a fail-safe IO circuit 320, and an IO power clamping IO circuit 420. The semiconductor IC device 300 may be a single chip, and may be controlled by an external device, i.e., a controller. It should be noted, however, that other types of configuration and operation of the semiconductor IC device 300, e.g., the semiconductor IC device 300 may be a master device capable of generating an internal control signal to operate the fail-safe IO circuit 320, are within the scope of the present invention.

The control signal receiving IO circuit 410 of the semiconductor IC device 300 may receive a predetermined control signal ECS from an external device, e.g., a controller, via a pad, i.e., PAD0. The control signal receiving IO circuit 410 may include a noise blocking buffer 407, as will be discussed in detail below with respect to FIG. 4, for removing noise from the predetermined control signal ECS in order to output a fail-safe control (CFSB) signal into the fail-safe IO circuit 320. The control signal receiving IO circuit 410 may output the CFSB signal into the fail-safe IO circuit 320 via a fail-safe control signal line 450, as illustrated in FIG. 2. When the CFSB signal is at a high level, i.e., logic value of "1," the semiconductor IC device 300 may be referred to as being at a "normal mode," i.e., transferring and/or receiving data. When the CFSB signal is at a low level, i.e., logic value of "0," the semiconductor IC device 300 may be referred to as being at a "fail-safe mode," i.e., a "standby" mode preventing and/or minimizing data transfer to and/or from the semiconductor IC device 300.

The fail-safe IO circuit 320 of the semiconductor IC device 300 may include a single fail-safe IO cell or a plurality of fail-safe IO cells, as illustrated in FIG. 1. For example, as shown in the partial illustration of the fail-safe IO circuit 320 of FIG. 2, the fail-safe IO circuit 320 may include a plurality of fail-safe IO cells 321-326. Each of the fail-safe IO cells 321-326 may include at least one respective gate circuit, i.e., one of the gate circuits 401-406. Each of the fail-safe IO cells 321-326 may be connected to a respective IO port via a pad PAD1-PAD6. Each of the fail-safe IO cells 321-326 may be further connected to the internal logic circuit 310 and to an external source.

When the control signal receiving IO circuit 410 outputs the CFSB signal through the fail-safe control signal line 450 toward a respective fail-safe IO cell 321-326, the CFSB signal may pass through a respective gate circuit 401-406. When the transmitted CFSB signal is a low level signal, a respective gate circuit 401-406 may provide high impedance (Hi-z) to a respective IO port of the fail-safe IO cell 321-326, thereby cutting off data transfer through a corresponding pad PAD1-PAD6 between the fail-safe IO cells 321-326 of the semiconductor IC device 300 and the common bus, as will be discussed in more detail below with respect to FIG. 5. When the CFSB signal is a high level signal, data output through IO ports of the fail-safe IO cells 321-326 may be controlled with respect to a signal generated by the internal logic circuit 310 and/or the external source. The fail-safe IO circuit 320 may be switched to the normal mode after the IO power and the core power are turned on.

The configuration and operation of the fail-safe IO circuit 320 and the control signal receiving IO circuit 410 according to embodiments of the present invention may be advantageous in providing control of data transfer between the semiconductor IC device 300 and the common bus regardless of the state of power applied to a core power line 430 and/or an IO power line 460 via the internal logic circuit 310 and/or the external source. More specifically, the fail-safe IO cells 321-326 of the fail-safe IO circuit 320 may control the fail-safe mode of each of the IO ports thereof directly via the respective gate circuits 401-406 with respect to the CFSB signal output via the control signal receiving IO circuit 410. In other words, when the CFSB signal is a low level signal, a high impedance state to a respective fail-safe IO cell 321-326 may be provided regardless of signals transmitted by the internal logic circuit 310 and/or the external source. Accordingly, the core power and the IO power may be applied and/or disconnected from the semiconductor IC device 300 in any sequence without affecting correct operation of the fail-safe mode thereof.

Figure 3:
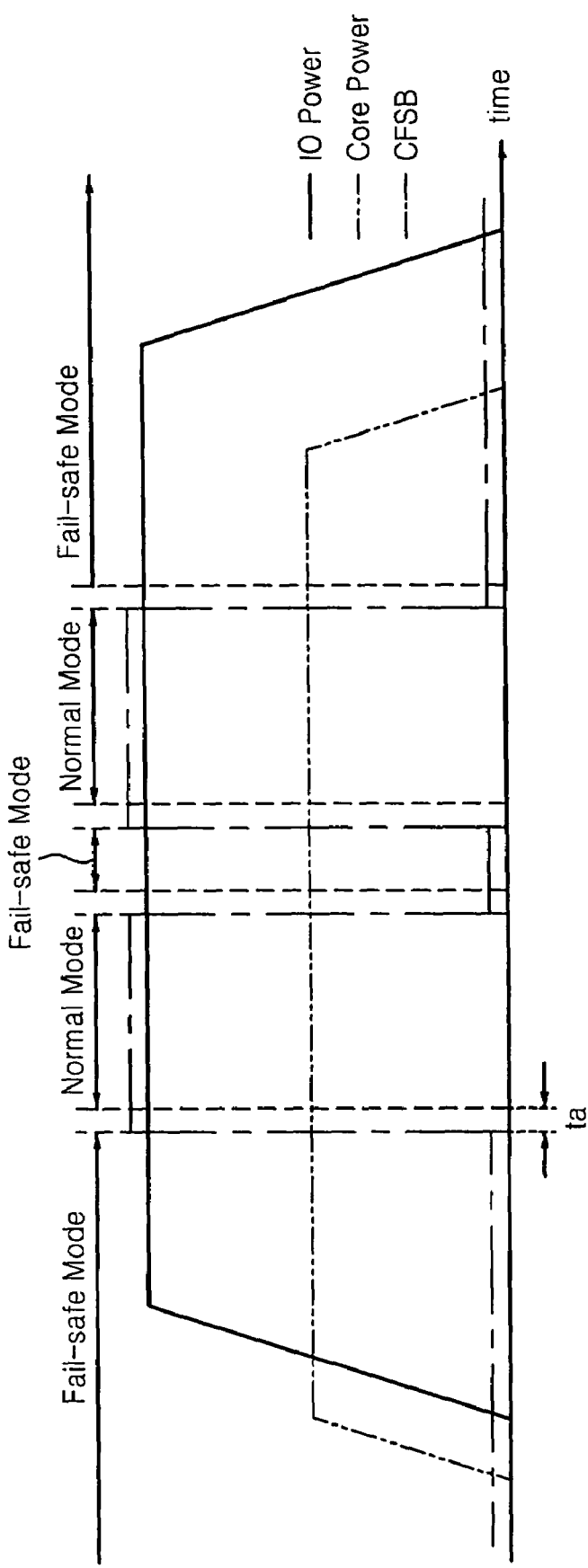
FIG. 3 illustrates a time diagram of a fail-safe control signal of the semiconductor IC device according to an embodiment of the present invention.

For example, as illustrated in FIG. 3, the fail-safe mode may be supported when the core power and/or IO power are rising or falling, i.e., not at a steady state. After the CFSB signal is enabled or disabled, a slight time delay may exist between a moment the CFSB signal changes to a moment a corresponding state is activated. For example, as further illustrated in FIG. 3, when the CFSB signal changes from "0" to "1," a time delay $t_a$ may lapse before the semiconductor IC device 300 changes from a fail-safe mode to a normal mode.

As further illustrated in FIG. 2, the IO power clamping IO circuit 420 of the semiconductor IC device 300 may include a switch 408, e.g., NMOS transistor, connected between the IO power line 460 and a ground signal line 440. The switch 408 may be activated when the fail-safe IO circuit 320 is at the fail-safe mode in order to maintain the IO power at the ground level. For example, when the fail-safe IO circuit 320 is at the fail-safe mode, a predetermined control signal CFS at a high level, i.e., a signal generated by inverting the CFSB signal output from the control signal receiving IO circuit 410, may activate the switch 408. If the IO power fluctuates, the CFSB signal may be maintained at a low level by coupling the fail-safe control signal line 450 to the ground signal line 440.

Figure 4:
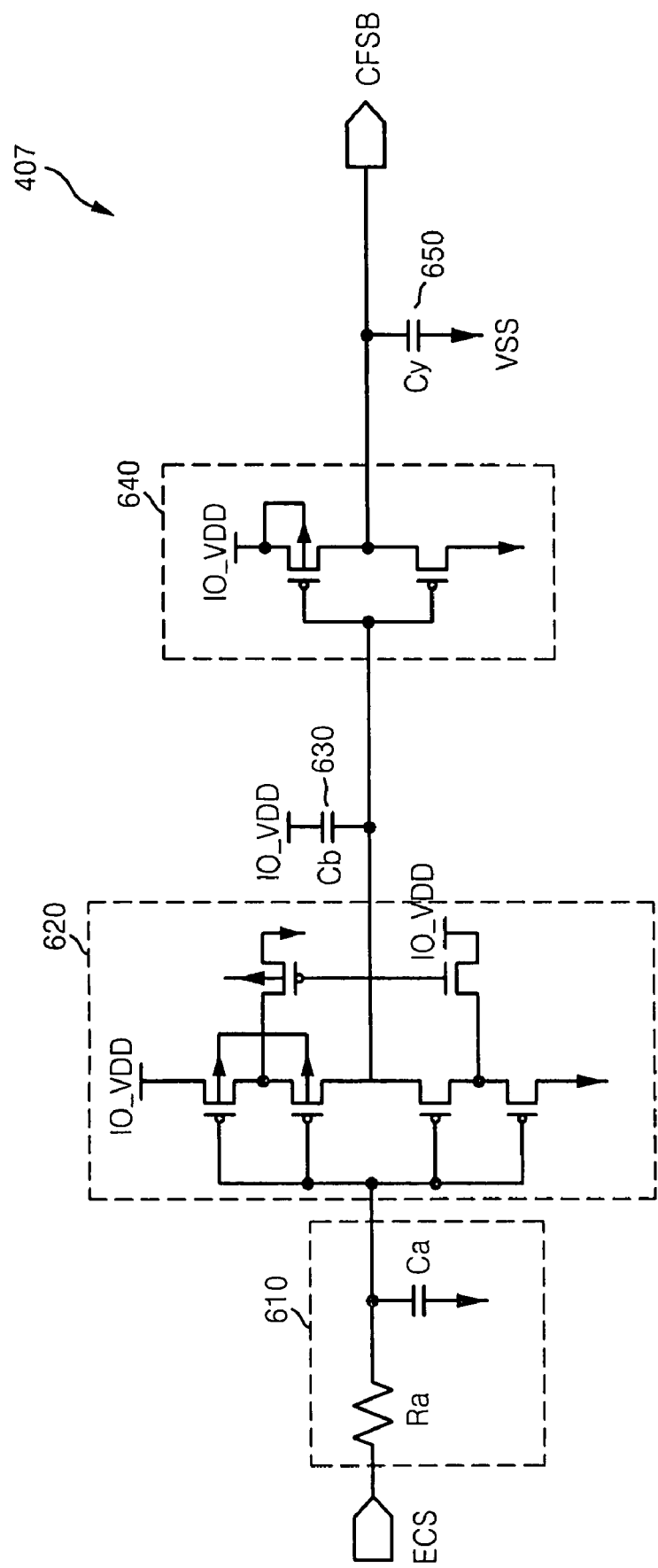
FIG. 4 illustrates a circuit diagram of a noise blocking buffer of a semiconductor IC device according to an embodiment of the present invention.

The noise blocking buffer 407 of the control signal receiving IO circuit 410, as illustrated in FIG. 4, may include an RC filter 610, a Schmitt-trigger inverter 620, a first state maintenance capacitor (Cb) 630, a CMOS inverter 640, and a second state maintenance capacitor (Cy) 650.

The RC filter 610 of the noise blocking buffer 407 may be a low pass filter capable of receiving the input signal ESC from the external source and removing noise therefrom, e.g., ground bounce noise generated by the external source. Thus, resistance and capacitance values Ra and Ca of the RC filter 610 may be set to remove noise in a range of about several hundreds MHz to about several MHz.

The Schmitt-trigger inverter 620 of the noise blocking buffer 407 may be a general Schmitt-trigger circuit capable of providing increased noise immunity to a signal output from the RC filter 610 from noise existing between the IO power and ground ports. The signal output from the Schmitt-trigger inverter 620 may be inverted in the CMOS inverter 640, so that the signal output from the Schmitt-trigger inverter 620 may be stored in the first state maintenance capacitor 630, and a signal output from the CMOS inverter 640 may be stored in the second state maintenance capacitor 650.

The first and second state maintenance capacitors 630 and 650 may be connected to the IO power and ground ports, respectively. Thus, the noise blocking buffer 407 may remove the noise of the ECS signal input, and may output a stable CFSB signal to the fail-safe signal line 450.

Figure 5:
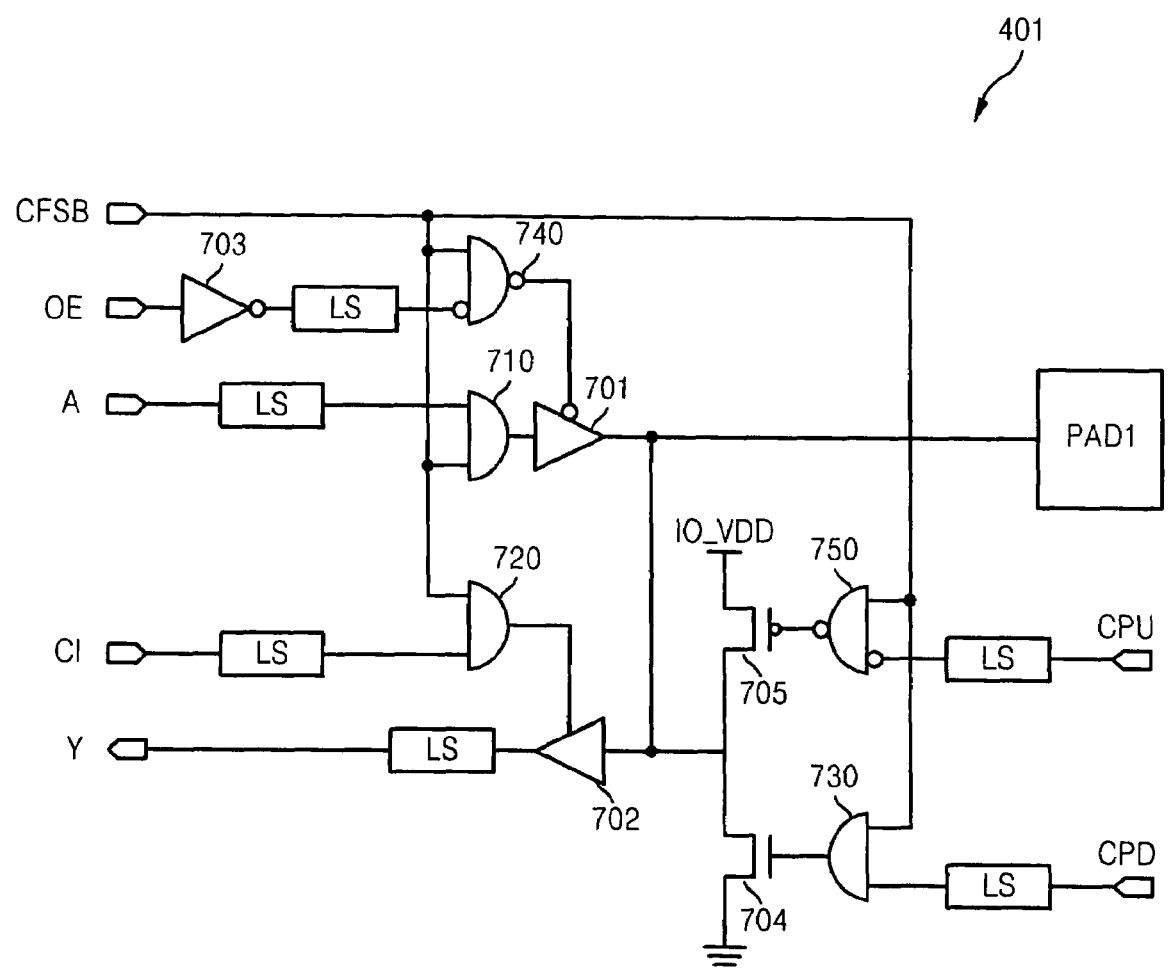
FIG. 5 illustrates a circuit diagram of a fail-safe IO circuit of a semiconductor IC device according to an embodiment of the present invention.

The stable CFSB signal may be transmitted via the fail-safe signal line 450 to the fail-safe IO circuit 320. For example, as illustrated in FIGS. 2 and 5, the CFSB signal may be transmitted into the gate circuit 401 of the fail-safe IO cell 321. The gate circuit 401 may include a first AND gate 710, a second AND gate 720, a third AND gate 730, a first NAND gate 740, and a second NAND gate 750. The gate circuit 401 of the fail-safe IO cell 321 may further include first and second buffers 701 and 702, an inverter 703, first and second transistors 704 and 705, and a plurality of level shifters LS.

The gate circuit 401 may receive an output enable (OE) signal, an input control (CI) signal, a data input signal (A), a pull-up control signal (CPU), a pull-down control signal (CPD), and the CFSB signal. The signals may be generated either outside the fail-safe IO cell 321, e.g., when the semiconductor IC device 300 is a slave device, or inside the fail-safe IO cell 321, e.g., when the semiconductor IC device 300 is a master device. The gate circuit 401 may include a data output signal Y.

The first AND gate 710 of the gate circuit 401 may receive the CFSB signal and the data input signal A, and may perform an AND operation. Thus, when the CFSB signal is at a high level, i.e., at a normal mode, the data input signal A may be output from the first AND gate 710, and may be input into the first buffer 701. On the other hand, when the CFSB signal is at a low level, i.e., at a fail-safe mode, a low level signal may be output from the first AND gate 710 as an input signal of the first buffer 701.

The second AND gate 720 of the gate circuit 401 may receive the CFSB signal and the CI signal, and may perform an AND operation. Thus, when the CFSB signal is at a high level, i.e., at a normal mode, the CI signal may function as an enable signal of the second buffer 702, i.e., an output of the second AND gate 720 input into the second buffer 702 may correspond to the CI signal. On the other hand, when the CFSB is at a low level, i.e., at a fail-safe mode, the second AND gate 720 may output a low level signal, thereby inputting a low level signal into the second buffer 702 and turning the second buffer 702 off.

The first NAND gate 740 of the gate circuit 401 may receive the CFSB signal and the OE signal, and may perform a NAND operation. Thus, when the CFSB signal is at a high level, i.e., at a normal mode, the OE signal may be inverted by the first inverter 703, and may be input as an enable signal into the first buffer 701. Accordingly, an output of the first buffer 701 may be controlled by the OE signal. On the other hand, when the CFSB signal is at a low level, i.e., at a fail-safe mode, the first NAND gate 740 may output a high level signal, thereby inputting an enable signal into the first buffer 701 and turning the first buffer 701 off, i.e., disabling output of the data signal A.

The third AND gate 730 of the gate circuit 401 may receive the CFSB signal and the CPD signal, and may perform an AND operation. Thus, when the CFSB signal is at a high level, i.e., at a normal mode, the third AND gate 730 may generate an output with respect to the CPD signal, thereby controlling operation of the first transistor 704. On the other hand, when the CFSB signal is at a low level, i.e., at a fail-safe mode, the third AND gate 730 may output a low level signal, thereby turning off the first transistor 704.

The second NAND gate 750 of the gate circuit 401 may receive the CFSB signal and the CPU signal, and may perform a NAND signal operation. Thus, when the CFSB is at a high level, i.e., at a normal mode, the second NAND gate 750 may generate an output with respect to the CPU signal, thereby controlling the operation of the second transistor 705. On the other hand, when the CFSB signal is at a low level, i.e., at a fail-safe mode, the second NAND gate 750 may output a high level signal, thereby turning off the second transistor 705.

The data input signal A and the CI, OE, CPU, and CPD signals may be applied to the first, second, and third AND gates 710, 720, and 730, and to the first and second NAND gates 740 and 750 via the level shifter LS.

When the fail-safe IO cell 321 operates at a normal mode, i.e., the CFSB is at a high level, the data input signal A may be transferred through the pad PAD1 into the common bus. When the fail-safe IO cell 321 operates at a fail-safe mode, i.e., the CFSB is at a low level, the pad PAD1 may be set at a high impedance state via the first, second, and third AND gates 710, 720, and 730, and via the first and second NAND gates 740 and 750, thereby cutting off signal transfer into the common bus. The fail-safe IO cells 322-326 of the fail-safe IO circuit 320 including the respective gate circuits 402-406 may be substantially similar to the gate circuit 401 of the fail-safe IO cell 321 in terms of configuration and operation. Accordingly, when the CFSB is at a low level, the pads PAD2-PAD6 corresponding thereto may be at a high impedance state to control data transfer therethrough.

Figure 6:
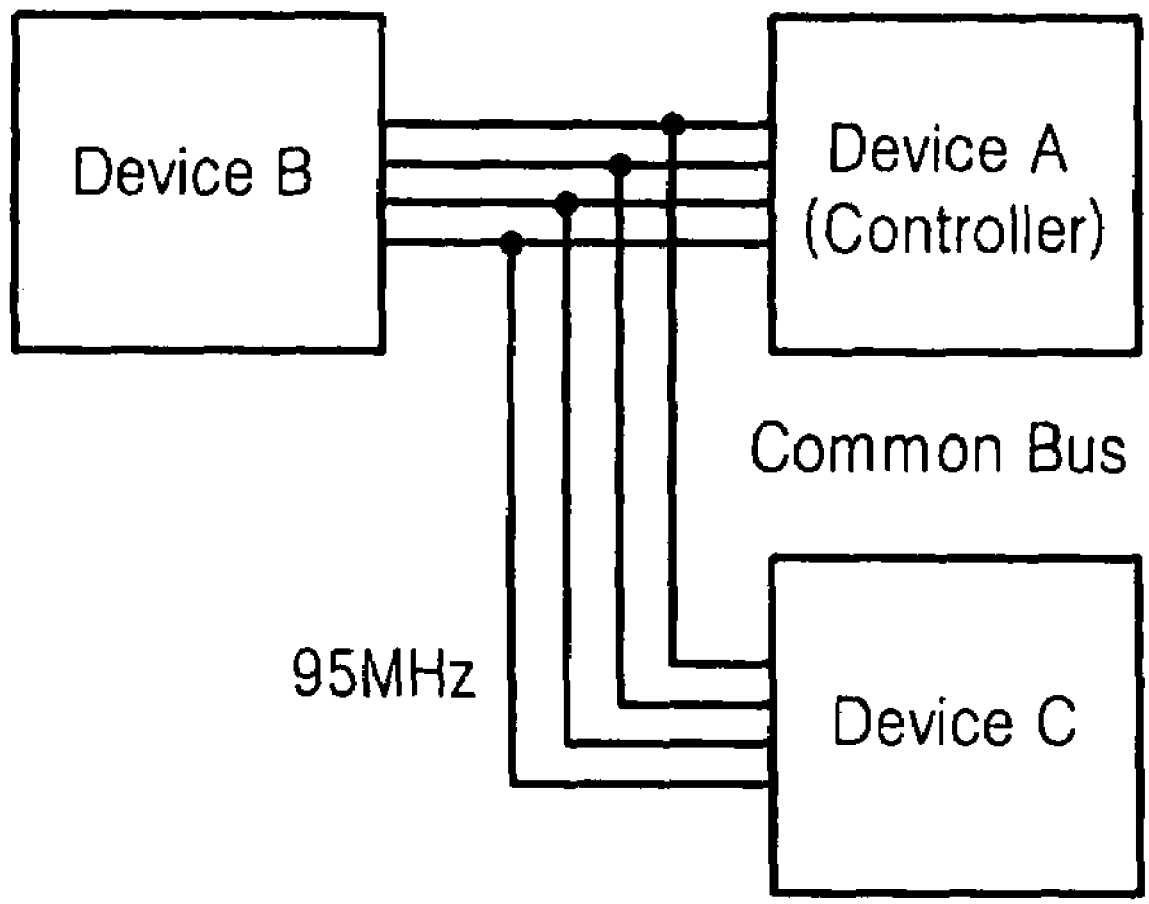
FIG. 6 illustrates a block diagram of an electronic device having a plurality of semiconductor IC devices according to an embodiment of the present invention.

According to another embodiment of the present invention, an electronic device may include a plurality of semiconductor elements connected to a common bus, such that at least one of the semiconductor elements thereof may include a fail-safe IO circuit. More specifically, as illustrated in FIG. 6, the electronic device may include first, second, and third semiconductor IC devices A, B, and C connected to a common bus. The first semiconductor IC device A of the electronic device may be a master device, e.g., a controller. The second and third semiconductor IC devices B and C may operate with respect to signals received from the first semiconductor IC device A via the common bus, i.e., slave devices. For example, the second semiconductor IC device B may receive a predetermined control signal from the first semiconductor IC device A, and may output a respective fail-safe control signal. More specifically, the second semiconductor IC device B may receive a predetermined control signal via a control signal IO circuit (not shown in FIG. 6) from the first semiconductor IC device A, and may output a corresponding fail-safe control signal via a fail-safe IO circuit (not shown in FIG. 6). Alternatively, the second semiconductor IC device B may be a master device, so that the predetermined control signal may be generated in the second semiconductor IC device B internally. The second semiconductor IC device B may be substantially similar to the semiconductor IC device 300 described previously with respect to FIGS. 1-5, and therefore, its detailed description will not be repeated herein.

When the second semiconductor IC device B is at the fail-safe mode, an IO port thereof may be at high impedance. Accordingly, the second semiconductor IC device B may have a minimized and/or no effect on communication between the first and third semiconductor IC devices A and C. Therefore, circuitry damage and/or erroneous signals in the electronic device may be substantially minimized and/or eliminated.

The semiconductor IC device according to embodiments of the present invention may be advantageous by providing a fail-safe mode, i.e., setting IO ports at a high impedance state, regardless of core power and/or IO power state and/or sequence. Therefore, the semiconductor IC device may be incorporated into an electronic device having a plurality of semiconductor IC device, i.e., subsystems, connected via a common bus, so that communication between specific subsystems may be controlled, i.e., signals from non-transmitting semiconductor IC devices and/or "standby" subsystems may be substantially eliminated or minimized. As such, potential erroneous signals may be substantially eliminated or minimized.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor integrated circuit (IC) device, comprising:
   at least one input/output (IO) port;
   a core logic;
   at least one fail-safe IO circuit, the fail-safe IO circuit being coupled between the core logic and the IO port, wherein the fail-safe IO circuit is configured to receive a signal indicating a fail-safe mode and to maintain the IO port at high impedance with respect to the signal indicating a fail-safe mode, and
   an IO power clamping IO circuit configured to maintain an IO power port as ground at the fail-safe mode.

2. The semiconductor IC device as claimed in claim 1, wherein the IO power clamping IO circuit includes an NMOS transistor coupled between the IO power port and a ground port, the NMOS transistor being received to the signal indicating a fail-safe mode.

3. The semiconductor IC device as claimed in claim 1, wherein the fail-safe IO circuit includes at least one gate circuit configured to receive the signal indicating a fail-safe mode.

4. The semiconductor IC device as claimed in claim 3, wherein the gate circuit is configured to turn off the IO port when the signal indicating a fail-safe mode is at a first logic state.

5. The semiconductor IC device as claimed in claim 3, wherein the gate circuit is configured to transfer data from the core logic when the signal indicating a fail-safe mode is at a second logic state.

6. A semiconductor integrated circuit (IC) device, comprising:
   at least one input/output (IO) port;
   a core logic; and
   at least one fail-safe IO circuit, the fail-safe IO circuit being coupled between the core logic and the IO port, wherein the fail-safe IO circuit is configured to receive a signal indicating a fail-safe mode and to maintain the IO Port at high impedance with respect to the signal indicating a fail-safe mode; and
   a control signal receiving IO circuit coupled to the fail-safe IO circuit, the control signal receiving IO circuit configured to receive an input signal and to output the signal indicating a fail-safe mode.

7. The semiconductor IC device as claimed in claim 6, wherein the control signal receiving IO circuit includes a noise blocking buffer having an RC filter and a Schmitt-trigger inverter.

8. The semiconductor IC device as claimed in claim 7, wherein the noise blocking buffer further comprises an inverter adapted to invert an output signal of the Schmitt-trigger inverter.

9. The semiconductor IC device as claimed in claim 7, wherein the noise blocking buffer further comprises at least one capacitor adapted to store an output signal of the Schmitt-trigger inverter.

10. A semiconductor integrated circuit (IC) device, comprising:
    at least one input/output (IO) port;
    a core logic; and
    at least one fail-safe IO circuit, the fail-safe IO circuit being coupled between the core logic and the IO port, wherein the fail-safe IO circuit is configured to receive a signal indicating a fail-safe mode and to maintain the IO port at high impedance with respect to the signal indicating a fail-safe mode, wherein the fail-safe IO circuit includes a plurality of fail-safe IO cells, each fail safe IO cell having a gate circuit and being coupled to a respective IO port.

11. An electronic device, comprising:
    a common bus; and a plurality of semiconductor integrated circuit (IC) devices coupled to the common bus, at least one of the semiconductor IC devices including at least one IO port connected to the common bus, a core logic, and at least one fail-safe input/output (IO) circuit coupled between the IO port and the core logic, the fail-safe IO circuit configured to maintain the IO port at high impedance with respect to a signal indicating a fail-safe mode and to set the semiconductor IC device at a fail-safe mode, wherein the semiconductor IC device having the fail-safe IO circuit is a master device.

12. The electronic device as claimed in claim 11, wherein the semiconductor IC device having the fail-safe IO circuit is configured to generate the signal indicating a fail-safe mode internally.

13. The electronic device as claimed in claim 11, further comprising a controller connected to the common bus.

14. The electronic device as claimed in claim 13, wherein the semiconductor IC device having the fail-safe IO circuit is configured to receive the predetermined control signal from the controller.

15. An electronic device, comprising:

a common bus; and a plurality of semiconductor integrated circuit (IC) devices coupled to the common bus, at least one of the semiconductor IC devices including at least one IO port connected to the common bus, a core logic, and at least one fail-safe input/output (IO) circuit coupled between the IO port and the core logic, the fail-safe IO circuit configured to maintain the IO port at high impedance with respect to a signal indicating a fail-safe mode and to set the semiconductor IC device at a fail-safe mode, wherein the semiconductor IC device having the fail-safe IO circuit further comprises a control signal receiving IO circuit configured to receive an input signal and to output the predetermined control signal.

16. An electronic device, comprising:

a common bus; and a plurality of semiconductor integrated circuit (IC) devices coupled to the common bus, at least one of the semiconductor IC devices including at least one IO port connected to the common bus, a core logic, and at least one fail-safe input/output (IO) circuit coupled between the IO Port and the core logic, the fail-safe IO circuit configured to maintain the IO port at high impedance with respect to a signal indicating a fail-safe mode and to set the semiconductor IC device at a fail-safe mode, wherein the fail-safe IO circuit of the semiconductor IC device includes a plurality of fail-safe IO cells, each fail safe IO cell having a gate circuit and being coupled to a respective IO port.

\* \* \* \* \*